United States Patent
Sivaswamy et al.

(10) Patent No.: US 11,790,139 B1
(45) Date of Patent: Oct. 17, 2023

(54) PREDICTING A PERFORMANCE METRIC BASED ON FEATURES OF A CIRCUIT DESIGN AND EXPLAINING MARGINAL CONTRIBUTIONS OF THE FEATURES TO THE PREDICTION

(71) Applicant: Xilinx, Inc., San Jose, CA (US)

(72) Inventors: Satish Sivaswamy, Fremont, CA (US); Garik Mkrtchyan, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 17/722,651

(22) Filed: Apr. 18, 2022

(51) Int. Cl.
G06F 30/31 (2020.01)
G06F 30/343 (2020.01)

(52) U.S. Cl.
CPC ............ G06F 30/31 (2020.01); G06F 30/343 (2020.01)

(58) Field of Classification Search
CPC ........ G06F 30/398; G06F 30/27; G06F 30/31; G06F 30/343; G06N 3/08; G06N 20/00
See application file for complete search history.

(56) References Cited

U.S. PATENT DOCUMENTS

| | | | | |
|---|---|---|---|---|
| 10,769,347 | B1 * | 9/2020 | Schuermyer | G06F 30/27 |
| 11,003,826 | B1 | 5/2021 | Dasasathyan et al. | |
| 11,256,845 | B2 * | 2/2022 | Nath | G06N 20/20 |
| 11,475,194 | B1 * | 10/2022 | Yeung | G06F 30/27 |
| 2018/0129771 | A1 * | 5/2018 | Hashimoto | G06F 30/34 |
| 2018/0197110 | A1 * | 7/2018 | Rao | G06F 30/398 |
| 2019/0228126 | A1 * | 7/2019 | Oh | G06F 30/327 |
| 2021/0173993 | A1 * | 6/2021 | Raman | G06F 30/27 |
| 2022/0004900 | A1 * | 1/2022 | Salahuddin | G06F 30/27 |
| 2022/0261654 | A1 * | 8/2022 | Wu | G06N 3/08 |

OTHER PUBLICATIONS

Tianqi Chen, et al., "XGBoost: A Scalable Tree Boosting System", arXiv:1603.02754v3 [cs.LG], Jun. 10, 2016.
Scott M. Lundberg, et al., "A Unified Approach to Interpreting Model Predictions", arXiv:1705.07874v2 [cs.Al], Nov. 25, 2017, 31st Conference on Neural Information Processing Systems (NIPS 2017), Long Beach, CA, USA.
L. S. Shapley, "Project RAND, Research Memorandum, Notes on the n-Person Game—II: The Value of an n-Person Game", Copyright 1951, U.S. Air Force, The RAND Corporation, Santa Monica, CA.

(Continued)

*Primary Examiner* — Nha T Nguyen
(74) *Attorney, Agent, or Firm* — Crawford Maunu PLLC

(57) ABSTRACT

A design tool determines features of a circuit design and applies a first model to the features. The first model indicates a predicted value of a metric based on the plurality of features. The design tool applies an explanation model to the features, and the explanation model indicates levels of contributions by the features to the predicted value of the metric, respectively. The design tool selects a feature of the plurality of features based on the respective levels of contributions and looks up a recipe associated with the feature in a database having possible features associated with recipes. The design tool processes the circuit design according to the recipe into implementation data that is suitable for making an integrated circuit (IC).

20 Claims, 7 Drawing Sheets

(56) References Cited

OTHER PUBLICATIONS

Fabian Pedregosa, et al., "Scikit-learn: Machine Learning in Python", Journal of Machine Learning Research 12(2011) 2825-2830, Submitted Mar. 2011; Revised Aug. 2011; Published Oct. 2011.

Larry McMurchie, et al., "PathFinder: A Negotiation-Based Performance-Driven Router for FPGAs", Proceedings of the Third International ACM Symposium on Field-Programmable Gate Arrays (FPGA'95).

Kirvy Teo, et al., "InTime Timing Closure Methodology for Vivado", FPGA Design Performance Optimization for Complex Designs, Plunify, Revised May 8, 2018.

Cheng Li, "A Gentle Introduction to Gradient Boosting", College of Computer and Information Science, Northeastern University, URL: http://www.ccs.neu.edu/home/vip/teach/MLcourse/4_boosting/slides/gradient_boosting.pdf, published 2014.

Max Kuhn, et al., "Feature Engineering and Selection: A Practical Approach for Predictive Models", https://bookdown.org/max/FES/recursive-feature-elimination.html, Taylor & Francis Group, Jun. 21, 2019.

Max Kuhn, etaL, "11.3 Recursive Feature Elimination", Feature Engineering and Selection, https://bookdown.org/max/FES/recursive-feature-elimination html, Taylor & Francis Group, Jun. 21, 2019.

* cited by examiner size = 1, congestion level = 8 size = 2, congestion level = 6

… (1) …

PREDICTING A PERFORMANCE METRIC BASED ON FEATURES OF A CIRCUIT DESIGN AND EXPLAINING MARGINAL CONTRIBUTIONS OF THE FEATURES TO THE PREDICTION

TECHNICAL FIELD

The disclosure generally relates to using machine learning models to predict a level of a performance metric based on circuit design features and to provide an explanation of levels of contributions of the features to the predicted level of performance.

BACKGROUND

Implementing a circuit design on a field programmable gate array (FPGA) is a complex process and can require considerable time, from specifying a hardware description language specification to generating configuration data for programming the FPGA. The tools used in implementing a circuit design, such as synthesis, logic optimization, placement and routing, attempt to solve NP complete (Nondeterministic Polynomial) problems. The tools employ heuristics to tradeoff factors of wirelength, timing and routing congestion, for example. The complexity of the algorithms involved makes the tools appear to designers as black boxes, and the tools often provide little useful feedback to the designers to satisfy performance requirements and improve designs.

The circuit implementation tools provide various algorithmic parameters that can be controlled by designers, and the tools can be operated using various combinations of parameter values to find a solution that satisfies timing, area, and power requirements ("achieve design closure"). Designers rely on expert intuition to identify those parameter values that could potentially lead to design closure. However, expert intuition alone may be insufficient given the scale of the problem and the number of parameters and values to be selected.

SUMMARY

A disclosed method includes determining a plurality of features of a circuit design by a design tool executing on a computer. The method includes applying a first model to the features by the design tool. The first model indicates a predicted value of a metric based on the plurality of features. The method includes applying an explanation model to the features by the design tool. The explanation model indicates levels of contributions by the features to the predicted value of the metric, respectively. The method includes selecting a feature of the plurality of features by the design tool based on the respective levels of contributions and looking up a recipe associated with the feature in a database having possible features associated with recipes. The method includes processing the circuit design by the design tool according to the recipe into implementation data that is suitable for making an integrated circuit (IC).

A disclosed system includes one or more computer processors configured to execute program code and a memory arrangement coupled to the one or more computer processors. The memory arrangement is configured with instructions of a design tool that when executed by the one or more computer processors cause the one or more computer processors to perform operations including determining a plurality of features of a circuit design and applying a first model to the features. The first model indicates a predicted value of a metric based on the plurality of features. The operations include applying an explanation model to the features. The explanation model indicates levels of contributions by the features to the predicted value of the metric, respectively. The operations include selecting a feature of the plurality of features based on the respective levels of contributions and looking up a recipe associated with the feature in a database having possible features associated with recipes. The operations include processing the circuit design according to the recipe into implementation data that is suitable for making an integrated circuit (IC).

Other features will be recognized from consideration of the Detailed Description and Claims, which follow.

BRIEF DESCRIPTION OF THE DRAWINGS

Various aspects and features of the methods and systems will become apparent upon review of the following detailed description and upon reference to the drawings in which.

DETAILED DESCRIPTION

Figure 1:
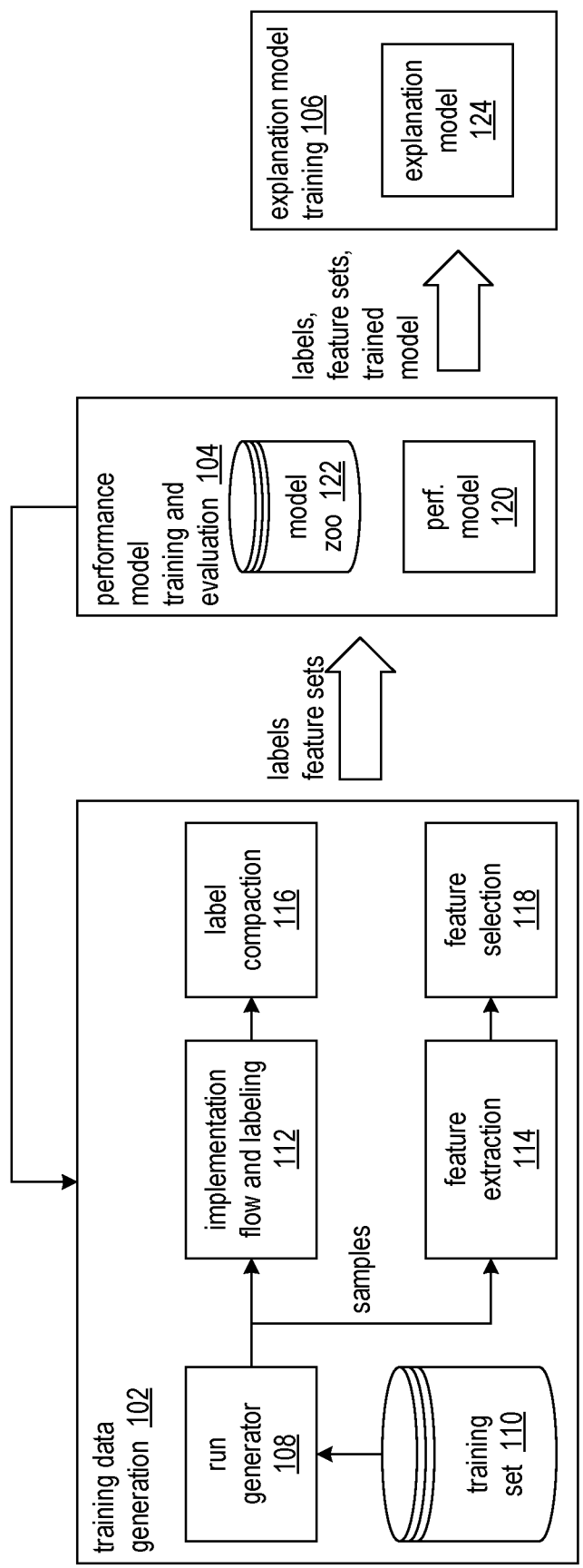
FIG. 1 shows a dataflow diagram of a system that trains machine learning models for predicting the level of a performance metric from features of a circuit design and for explaining marginal contributions of those features to the predicted level of performance.

In the following description, numerous specific details are set forth to describe specific examples presented herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element.

Electronic Design Automation (EDA) tool and/or device vendors have attempted to alleviate the problem of achieving design closure by providing machine learning (ML)-based tools that suggest strategies for achieving design closure. Though existing ML tools can reduce the search space, the ML models are not closely aligned with particular algorithms of the implementation tools, the ML models provide no reasons for suggesting a particular strategy or factors contributing to a poor performance metric, and the ML models do not provide clear indications as to particular problem areas to consider and prioritization of problem areas. A "performance metric" as used herein refers to any of metric of interest that is an attribute of a circuit implemented according to a circuit design or the processing of the circuit design. That is the performance metric can indicate how well the implemented circuit is expected to perform (e.g., maximum clock speed or power consumption) or the expected performance of an EDA implementation tool in processing the circuit design (e.g., tool runtime). Also a performance metric can indicate a static attribute of the implemented circuit, such as the area of an IC occupied by an implementation of the circuit.

Figure 2:
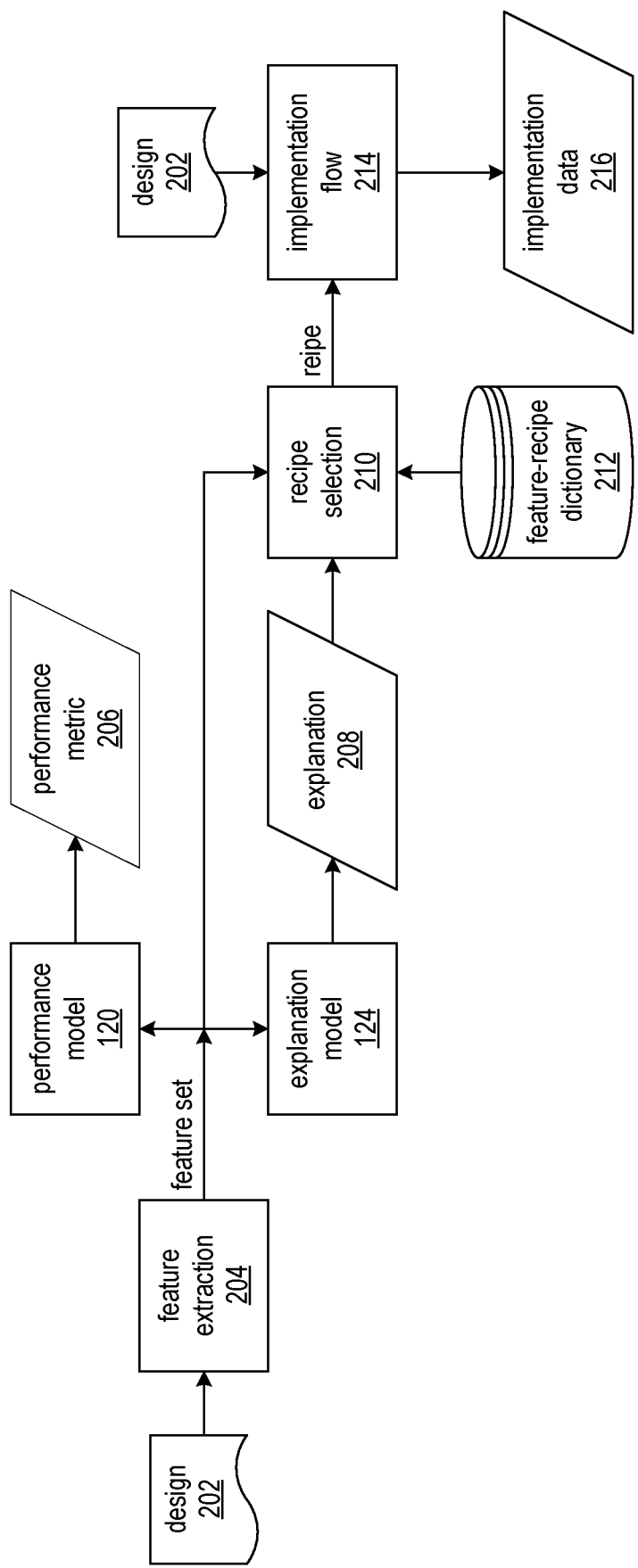
FIG. 2 shows a dataflow diagram of a system that uses machine learning models to predict the level of a performance metric from features of a circuit design and to explain marginal contributions of those features to the predicted level of performance.
Figure 4:
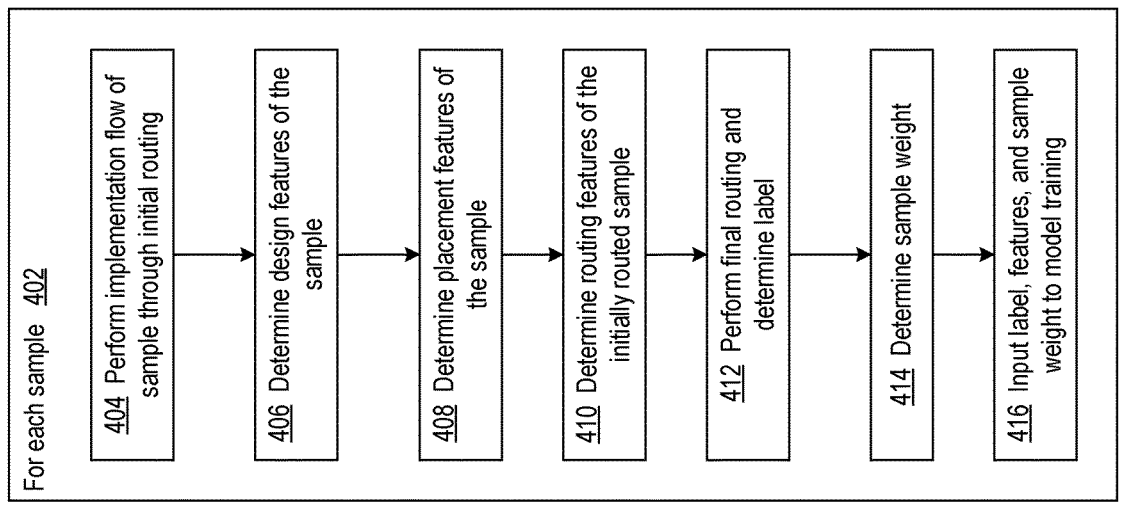
FIG. 4 show a flowchart for training a machine learning model to predict the runtime a design tool will expend in routing a circuit design.

The disclosed methods and system provide an explainable ML-based analyzer that provides explanations as to why certain performance metrics are poor. The explanations identify features of the circuit design that likely affect the performance metric and can be closely aligned with particular algorithms of the implementation tools. The marginal contributions of the design features to the performance metric are prioritized and presented to aid in root-cause analysis. The methods and system also provide recipes for modifying a design and/or adjusting tool parameters to improve a performance metric. FIG. 1 illustrates building of the models, FIG. 2 illustrates use of the models, and FIG. 4 shows an example in which models are built for a specific performance metric.

FIG. 1 shows a dataflow diagram of a system that trains machine learning models for predicting the level of a performance metric from features of a circuit design and for explaining marginal contributions of those features to the predicted level of performance. The training system performs processes of generating training data, training and evaluating a performance model, and training an explanation model as shown by blocks 102, 104, and 106, respectively. The performance model is shown as block 120, and the explanation model is shown as block 124.

The generation of training data uses circuit designs in a training set 110. The training set 110 includes circuit designs that are representative of designs in development and that benefit from performance analysis while undergoing an implementation flow. The circuit designs can be specified in register transfer level languages (RTLs), hardware description languages (HDLs), or high-level languages (HLLs), or combinations thereof.

The run generator 108 prepares samples from circuit designs in the training set. Each sample is a combination of a circuit design and an associated set of parameter settings used by tools in the implementation flow. Combinations of the same circuit design and different sets of parameter settings are different samples. Each sample is run through the implementation flow and labeling processes of block 112.

The implementation flow of block 112 can include one or more implementation phases of synthesis, netlist optimization, placement, physical synthesis, and routing for each input sample. The label value can be determined once the implementation flow has completed the phase at which the data needed to determine the label value is available. The label value can be a performance metric that indicates a runtime of the design tool, such as the runtime expended in routing a design. Alternatively, the label value can indicate a performance metric of the circuit design, such as area, clock frequency, power. The labeling process can involve additional processing such as static or dynamic analysis of circuit design data produced during the implementation flow to determine label values of some performance metrics.

The feature extraction process 114 can initially extract a universal set of features from designs in the samples produced by the run generator 108. The design features that can potentially impact the performance metric of interest can be determined by subject matter experts in the area of choice. Features that are most relevant to the metric of interest can be reduced by the feature selection process 118. According to an exemplary implementation, the reduced set having the relevant features can be obtained by employing a Recursive Feature Elimination (RFE) algorithm. Once the relevant set of features has been selected, the feature set of each sample and the associated label value can be provided to the performance model training process 104.

The label compaction process 116 can be optionally performed, depending on whether the metric of interest can be modeled by categorical labels or by continuous labels and whether a classification model or regression model can be used. For example, if the metric of interest is the runtime of an EDA tool, or a sub-process of the tool, the number of units of work in a processing loop of the tool can be used as a proxy for the runtime, and a regression model can be trained to predict the runtime. Alternatively, if the metric of interest is a quality-of-results metric (e.g., speed, power, area), the measured metric can be binned in a histogram and categorical labels can be used in a classification model. It will be recognized that the approaches for modeling performance and explanations are not limited to a particular metric or type of model.

The performance model training and evaluation processes 104 generate performance model 120 based on the labels and associated feature sets produced by the training data generation processes 102. The training and evaluation is an iterative process, and the training process can train machine learning models of different types from the model zoo 122 and evaluate the resulting models for accuracy.

The evaluation process can tune the parameters of each model until a threshold level of accuracy is reached and can then determine the model that is most accurate for the metric of interest. Examples of model parameters that can be adjusted for a gradient boosted tree include depth, number of branches, partitioning. For a neural network, the number of layers can be specified by a parameter value.

If a desired level of prediction accuracy is not achieved (e.g., over- or under-fitting) from a population of labels and associated features sets, the training data generation processes 102 can be repeated. A larger population of samples can be generated by increasing the number runs using different sets of parameters and parameter values in the processes of the implementation flow 112. Additional features can also be selected to include in the feature sets.

Once the performance model 120 is suitably trained, the performance model, feature sets, and associated labels are input to the explanations model training process 106. According to one approach, the explanation model training process 106 trains the explanation model 124 to output Shapley values to explain the output of the performance model. The Shapley values indicate relative importance of the features of a circuit design to the predicted performance metric for that design. Specifically, each Shapley value indicates a marginal level of contribution of a feature to the predicted performance metric. The Shapley values provides design-specific explanations as opposed to explanations applicable to an entire population of samples. The Shapley value of a feature is the average marginal contribution of that feature to the predicted level of the performance metric. Well known libraries, for example, "SNAP" (SHapley Additive exPlanations) are available to compute Shapley values.

FIG. 2 shows a dataflow diagram of a system that uses machine learning models to predict the level of a performance metric from features of a circuit design and to explain marginal contributions of those features to the predicted level of performance. The circuit design 202 to be analyzed is input to a feature extraction process 204. The circuit design can include specifications and data generated or captured through processes of synthesis, optimization, placement, and routing.

The feature extraction process determines the feature set of the circuit design consistent with the relevant features determined by the feature extraction and selection processes 114 and 118 of FIG. 1. The extracted feature set is provided as input to both the performance model 120 and to the explanation model 124.

The performance model 120 generates a predicted value of the metric of interest 206 ("performance metric"), and the explanation model 124 generates an explanation for the predicted value ("explanation" 208). The explanation specifies quantitative marginal contributions of each feature of the feature set extracted by the feature extraction process. Each marginal contribution is an approximation of a relative amount by which the feature impacted the predicted value of the metric.

Once the feature set and the marginal contributions of the features are known, the information can be used to automatically (or manually) modify the design and/or tool parameters in an effort to improve the metric. According to the disclosed methods and systems, a feature-recipe dictionary 212 and a recipe selection process 210 provide a mechanism to determine steps that would likely improve the metric.

The feature-recipe dictionary specifies one or more actions (a "recipe") associated with each feature. The sets of actions can be compiled by subject matter experts and specified in a database that is indexed by identifiers of the features in the feature set. The recipe selection process inputs the feature set and explanation and determines a recipe based on the marginal contributions of the features. For example, the recipe selection process can identify the feature having the greatest marginal contribution and lookup the associated recipe in the dictionary 212. Recipes associated with multiple features can be combined into a single recipe for features having a marginal contribution that is greater than a threshold. The action(s) specified in the generated recipe can be input to one or more tools of the implementation flow 214.

Examples of adjustments to tool parameters include, without limitation, limiting a maximum number of fanouts of signals and synthesizing logic to look-up-tables (LUTs) having lesser numbers of inputs instead of synthesizing logic to LUTs having greater numbers of inputs in order to reduce pin-density and routing congestion. Examples of design modifications can include, without limitation, resynthesizing memories to tradeoff width versus depth, instantiating global clock buffers to drive very large asynchronous reset nets, and moving some carry chains to digital signal processing (DSP) blocks.

Depending on the actions of the recipe, the circuit design 202 can be modified and/or parameters input to one or more of the tools can be adjusted. A final tool or phase can generate implementation data 216 that is suitable for making an integrated circuit (IC). For example, the implementation data can be used to fabricate an application-specific (ASIC) to configure a programmable IC, such as a field programmable gate array (FPGA).

Figure 3:
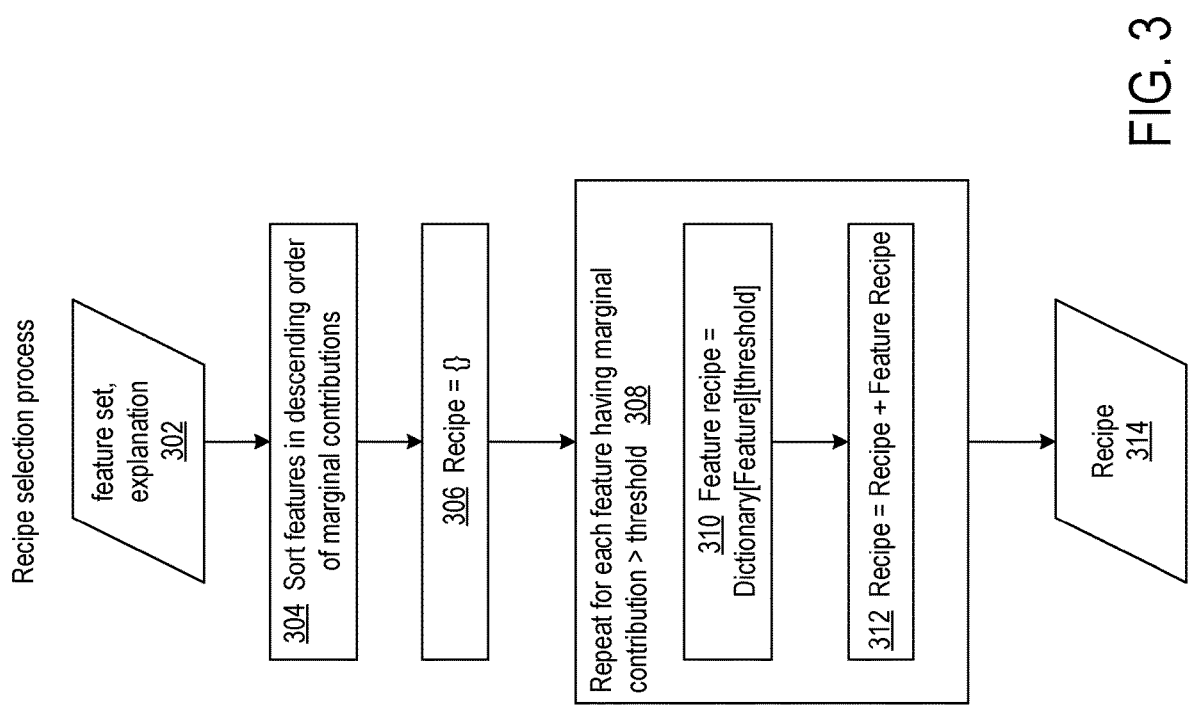
FIG. 3 shows a flowchart of the recipe selection process shown in FIG. 2.

FIG. 3 shows a flowchart of the recipe selection process 210 shown in FIG. 2. The input data 302 to the process includes a feature set and the explanation of the marginal contributions of the features in the feature set to the predicted value of the metric of interest.

At block 304, the features of the feature set are sorted in order of the levels of marginal contribution. For example, the sort order can be in descending order of the levels of marginal contribution. At block 306, the recipe (the "Recipe") under construction is initialized to an empty set, and the operations of block 308 are repeated for each feature having a marginal contribution greater than a general threshold. The general threshold can be determined and adjusted based on experimentation.

At block 310, the process accesses a database and looks-up the recipe (the "Feature recipe") associated with the feature having a marginal contribution greater than the general threshold. The database implements a dictionary having sets of actions associated with feature identifiers. The database can be indexed by the feature identifiers. In addition to the general threshold used to screen for features of interest, additional secondary thresholds can be used to select between different recipes for the same feature. For example, for a given feature, action A can be specified in the database and taken if the level of marginal contribution is less than or equal to a secondary threshold value, T1, action B can be specified and taken if the level of marginal contribution is greater than T1 and less than or equal to secondary threshold value, T2, and action C can be specified and taken if the level of marginal contribution it is greater than T2 and less than or equal to secondary threshold value T3. The notation, "Dictionary[Feature][threshold]" indicates that a feature can have alternative recipes, and the selected one of the alternative recipes is based on the level of marginal contribution relative to the secondary threshold(s).

At block 312, the process adds the Feature recipe from block 310 to the Recipe. Once all the features having marginal contributions greater than the threshold in the feature set have been processed, the Recipe is provided as the output data 314 from the recipe selection process.

FIGS. 4, 5, 6, and 7 show an example in which models are built for a router runtime performance metric. Router runtime is of interest because routing can be the most compute intensive phase of an implementation flow, and routing tools often provide little information to designers as to how runtime can be reduced.

FIG. 4 show a flowchart for training a machine learning model to predict the runtime a design tool will expend in routing a circuit design ("routing runtime"). The processing of block 402 is performed for each sample in a population of samples. The samples can be based on a large number (e.g., 500 or more) of different circuit designs having a large variance in router runtime. Each sample is a combination of a circuit design and an associated set of parameter settings used by tools in the implementation flow. The features selected for relevancy to routing runtime are discussed below in association with block 410. According to an exemplary approach, runs based on the samples can be launched and executed in parallel on a cluster of computing arrangements, with each computing arrangement having one or more processors (or cores) and dedicated memory space.

At block 404, the process performs a partial implementation flow on the sample. The partial implementation flow includes phases of the implementation flow through an initial routing of the circuit design. The initial routing is a preliminary assignment of all nets to routing resources of the of the target device. The complete set of assignments resulting from the initial routing may be not be legal as there may be conflicts for routing resources. A final detailed routing phases attempts to resolve all conflicts and produce a legal result. For training the performance model, relevant design and placement features are available after completing the initial routing, and the effort involved in performing the initial routing is also a feature as explained below.

In the exemplary application, the performance model for router runtime prediction is based on gradient boosted decision trees. The types of features used in the model can be generally classified as design features, placement features, and routing features. Notably, the selected features are easy to compute. That is, extracting the selected features in a use-case design does not require extensive computing resources, thereby avoiding incurring a large runtime penalty to obtain the features.

At block 406, the process determines design features of the sample. The design features can include utilization metrics, a number of high-fanout nets, and an initial total negative hold slack. For an exemplary target device being an FPGA, the design utilization metrics can be utilization levels of lookup tables ("LUTs") and block RAMs ("BRAMs"). Greater levels of utilization typically imply greater difficulty in legally routing the design and thereby a longer routing runtime.

High fanout nets require significant numbers of routing resources and have a greater probability of encountering congestion than do low fanout nets. For example, nets having in the range of 1000 loads can be treated as high fanout nets. Therefore, a greater number of high fanout nets is likely to incur a greater router runtime than a lesser number of high fanout nets.

The feature of initial total negative hold slack indicates the total hold violation seen in the design at the start of the router, that is prior to any routing of nets. The initial total negative hold slack is a sum of amounts of negative hold slack on paths having negative hold slack. The feature reflects the complexity in routing clock signals of the design as most of the hold slack is a result of high clock skews. To resolve negative hold slack, the detailed router adds routing detours, which can increase routing congestion and routing runtime.

At block 408, the process determines placement features of the sample. The placement features can include "2-pin wirelength," pin density, "SLL" congestion, and maximum "SLR" utilization. The feature of 2-pin wirelength is an average of the wirelengths of nets connecting only two pins. On average, a significant majority of nets in the design are two-pin nets. The average wirelength of those nets provides an indication of the degree to which the placement is compact or spread out, and is thereby an indicator of the expected routing runtime.

The pin density is the ratio of number of pins used by the design in a tile of an FPGA to the total number of pins available in the tile. An FPGA can have tiles disposed in a grid on a semiconductor die. Each of the tiles has programmable routing resources that can be designated to carry signals specified in the circuit design. The pin density feature is the number of tiles having pin densities greater than 75%. The pin density feature indicates how compactly a design is placed. A greater value of the pin density feature may cause significantly greater routing runtime devoted to localized routing.

"SLL" connotes super long lines in Xilinx FPGAs. SLLs connect super logic regions (SLRs), and an SLR is a single FPGA die slice contained in a stacked silicon interconnect device. The feature of SLL congestion quantifies the largest region of the device in which SLLs are over utilized. SLL congestion is an important feature for multi-SLR devices, as the number of SLLs between SLRs is very limited. Thus, a large level of SLL congestion makes likely the need for the routing process to expend significant runtime in detouring routes. SLL congestion can be computed by first estimating optimum locations at which signals would cross SLR boundaries, assuming there is no restriction on the available SLL capacity in a local region. The optimum location can be determined by considering the placement of driver and loads. Once the optimum locations of SLLs are computed for all SLR crossing nets, the largest region in the device where the ratio of demand to the available capacity exceeds 100% can be estimated. Thus, SLL congestion indicates the largest region of the device in which there is insufficient available SLL capacity to satisfy demand of all SLR crossing nets.

The feature of maximum SLR utilization entails two features. One feature is the maximum utilization level of LUTs across all SLRs of the target device, and the other feature is the maximum utilization level of BRAMs across all SLRs of the device. These features capture the effect of partitioning the design into different SLRs.

At block 410, the process extracts the routing features of the design. The relevant routing features include the effort involved in performing the initial routing and the level of congestion in the initial routing. The number of routing expansions performed in the initial routing is used as a proxy for the level of effort. The number of routing expansions effectively indicates the size of the design (e.g., the number of nets) and the level of effort required to obtaining a legal, detailed routing. The number of routing expansions is the number of nodes visited in exploring possible routes from one node to another.

The congestion feature indicates the utilization of routing resources within a region of the target device. The routing utilization is defined as the ratio of the wirelength devoted to routed signals to the total wirelength available within a region. Larger regions having routing resource utilization >1 will require more routing runtime than will smaller regions having routing resource utilization >1. After the initial routing, an accurate estimate of the design level routing utilization can be obtained. To capture the locality of congestion, an average of routing resource utilizations in adjacent routing areas, which together form a region, can be calculated for increasing sizes of regions.

To illustrate how the congestion feature can be determined, the utilization of routing resources of an FPGA is described. The routing utilization of a tile (or "routing area") is defined as the ratio of the wirelength devoted to routed signals within the tile to the total wirelength available in the tile.

Determining the congestion feature involves pooling routing resource utilizations in sets of adjacent tiles. According to an exemplary approach, the routing resource utilizations are pooled by computing the averages of the routing resource utilizations of all possible arrays of adjacent tiles, for one or more sizes of arrays. For example, averages of routing resource utilizations can be computed for all possible 16-tile×16-tile arrays of the device. Each possible array is a region of the device. Multiple congestion features can be determined for multiple region sizes. For example, the process can determine a congestion feature based on 32-tile× 32-tile regions, 64-tile×64-tile regions, 128-tile×128-tile regions, etc.

One or more congestion features can be determined by counting for each region size, the number of regions having an average routing area utilization >1. The number of regions having an average routing area utilization >1 indicates the degree to which congestion is localized in the initially routed design. Additional congestion features can be determined for particular types of routing resources within the regions. For example, the congestion features can describe levels of routing resource utilizations for resources that span vertical directions, for horizontal directions, and different lengths of resources (e.g., long and short).

Figure 5:
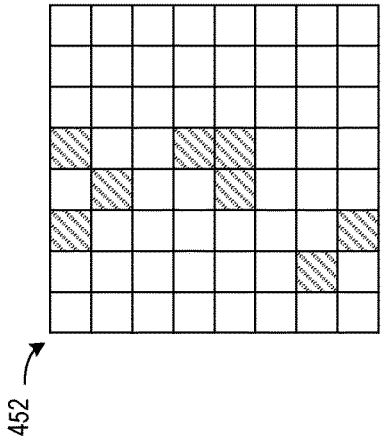
FIG. 5 shows the congestion feature determined for a region size of 1-tile×1-tile in a grid of tiles of a target device.
Figure 6:
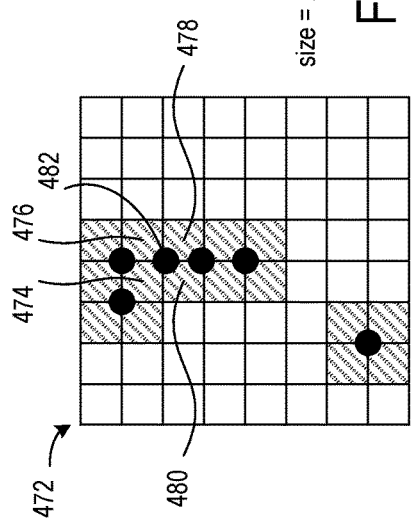
FIG. 6 shows the congestion feature determined for a region size of 2-tiles×2 tiles in a grid of tiles of a target device.

FIGS. 5 and 6 show examples to illustrate the algorithm for determining congestion features for different sizes of regions. The routing areas in the examples are tiles of an FPGA. Each square is a tile. It will be recognized that the examples are simplified from actual FPGAs as FPGAs have many more routing tiles than those illustrated.

FIG. 5 shows the congestion feature determined for a region size of 1-tile×1-tile in a grid of tiles 452 of a target device. As the region size is a single tile, the average routing resource utilization for each region is the routing resource utilization of the tile. The congestion feature determined for the example is 8, as 8 tiles have levels of routing resource utilization greater than 1, as shown by the diagonal line-filled squares.

FIG. 6 shows the congestion feature determined for a region size of 2-tiles×2 tiles in a grid of tiles 472 of a target device. The levels of routing utilization of the tiles are pooled by averaging the levels of routing utilization tiles in 2-tile×2-tile areas. The 6 solid-filled circles illustrate centers of 6 regions in which the averages of the routing utilization in the tiles of those regions is greater than 1. The tiles comprising each region having an average level of routing utilization greater than 1 are shown as diagonal line-filled squares. For example, the average of the levels of routing utilization in tiles 474, 476, 478, and 480, which are centered circle 482 is greater than 1. Congested regions can overlap as the process determines average levels of routing utilization for all possible 2-tile×2-tile areas.

Returning now to FIG. 4, at block 412 the process performs a final detailed routing of the design and determines the effort involved in performing the detailed routing. The metric of interest is router runtime. To prevent perturbations in predictions due to variations in the clusters performing the runs, a proxy is used to represent router runtime. According to the exemplary approach, the size of the search space explored by the router (i.e., the number of router expansions) in the process of connecting and legalizing the routing for all nets in the design is used as a proxy and is the label for the router runtime.

At block 414, the process determines a weight to be applied in training the performance model on the sample features. Weighting sample features makes the cost of incorrectly predicting the long running designs higher.

According to the exemplary algorithm, each sample is weighted in proportion to the number of expansions. A threshold of 5 billion expansions is used. For samples in which the number of expansions is less than or equal to 5 billion, the sample weight is assigned the value 1. For samples in which the number of expansions is greater than 5 billion, the sample weight is assigned the value of the number of expansions/5 billion. This weighting of samples in this manner gives greater emphasis to long running samples, which trains the performance model to more accurately predict designs having comparable feature sets.

At block 416, the label value, feature set, and sample weight are input to the training and evaluation processes to train the performance model.

Figure 7:
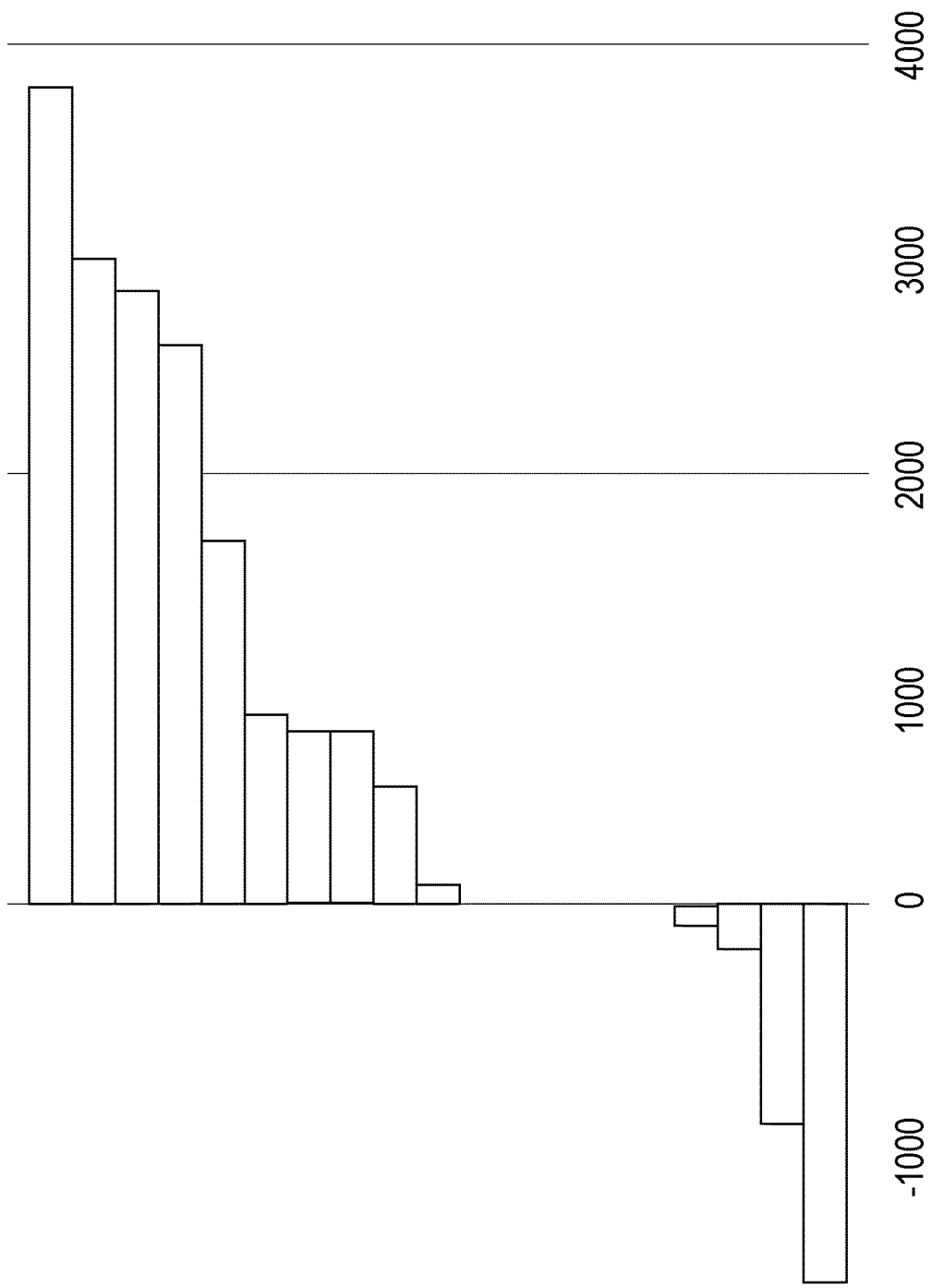
FIG. 7 shows in graph form an exemplary explanation of the marginal contributions to routing runtime of features of a particular circuit design.

FIG. 7 shows in graph form an exemplary explanation of the marginal contributions to routing runtime of features of a particular circuit design. The features are listed in the column on the left, and bars aligned with the features represent the contribution of each feature to the final prediction. The X-axis represents the number of expansions, and the length of each bar represents the marginal contribution of that feature to the predicted total number of expansions. Bars that extend to the right of the 0-expansions line represent the number of expansions by which the features increase the predicted total number of expansions, and the bars that extend to the left of the 0 expansions line represent the number of expansions by which the features reduce the predicted total number of expansions.

The graph shows that features such as pin density ("Pin-Density"), maximum BRAM utilization ("MaxBRA-MUtil"), number of high fanout nets ("HighFanoutNets"), high congestion ("CongLevel6HorzLong" and "CongLevel5HorzLong") and initial THS ("InitTHS") all contribute to an increase in predicted number of expansions. LUT utilization ("MaxLUTUtil" and "LUTUtil"), SLL cluster width ("SLLClusterWidth" aka "SLL congestion") and initial routing expansions ("InitialRouteExpand") all contribute to reducing the predicted number of expansions. The explanation indicates qualitatively and quantitatively the relative impacts of the features on the number of expansions.

The congestion features labeled CongLevel6HorzLong, CongLevel5HorzLong, CongLevel6VertLong, CongLevel5VertLong, CongLevel5VertGlobal, CongLevel5HorzGlobal, CongLevel6VertGlobal, CongLevel7HorzLong indicate congestion levels determined for different types of routing resources disposed in different orientations for different sizes of regions. The notation for the different congestion features is CongLevel<k><Direction><Type> where k=$\log_2$(region size), Direction is Vertical/Horizontal, and Type is Long/Short/Global. The "region size" is the number of rows (or columns) of tiles in the region.

Figure 8:
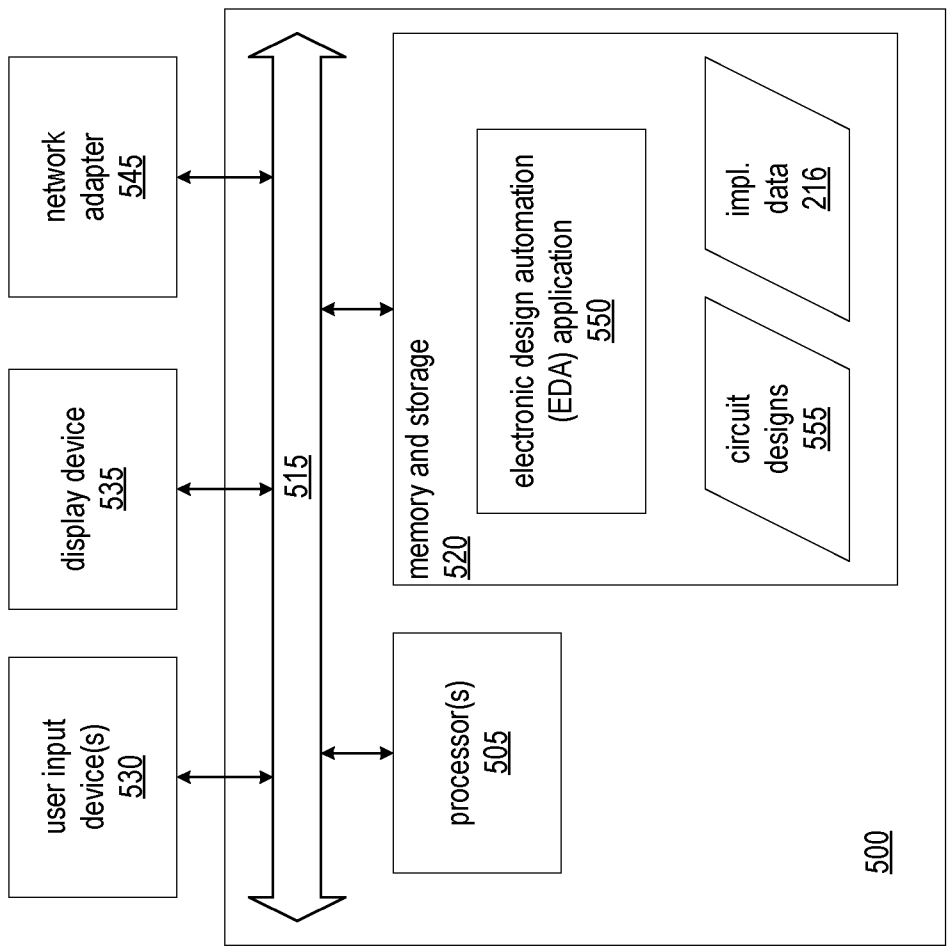
FIG. 8 is a block diagram illustrating an exemplary data processing system.

FIG. 8 is a block diagram illustrating an exemplary data processing system (system) 500. System 500 is an example of an EDA system. As pictured, system 500 includes at least one processor circuit (or "processor"), e.g., a central processing unit (CPU) 505 coupled to memory and storage arrangement 520 through a system bus 515 or other suitable circuitry. System 500 stores program code and circuit design 100 within memory and storage arrangement 520. Processor 505 executes the program code accessed from the memory and storage arrangement 520 via system bus 515. In one aspect, system 500 is implemented as a computer or other data processing system that is suitable for storing and/or executing program code. It should be appreciated, however, that system 500 can be implemented in the form of any system including a processor and memory that is capable of performing the functions described within this disclosure.

Memory and storage arrangement 520 includes one or more physical memory devices such as, for example, a local memory (not shown) and a persistent storage device (not shown). Local memory refers to random access memory or other non-persistent memory device(s) generally used during actual execution of the program code. Persistent storage can be implemented as a hard disk drive (HDD), a solid state drive (SSD), or other persistent data storage device. System 500 may also include one or more cache memories (not shown) that provide temporary storage of at least some program code and data in order to reduce the number of times program code and data must be retrieved from local memory and persistent storage during execution.

Input/output (I/O) devices such as user input device(s) 530 and a display device 535 may be optionally coupled to system 500. The I/O devices may be coupled to system 500 either directly or through intervening I/O controllers. A network adapter 545 also can be coupled to system 500 in order to couple system 500 to other systems, computer systems, remote printers, and/or remote storage devices through intervening private or public networks. Modems, cable modems, Ethernet cards, and wireless transceivers are examples of different types of network adapter 545 that can be used with system 500.

Memory and storage arrangement 520 may store an EDA application 550. EDA application 550, being implemented in the form of executable program code, is executed by processor(s) 505. As such, EDA application 550 is considered part of system 500. System 500, while executing EDA application 550, receives and operates on circuit designs 555. In one aspect, system 500 constructs a performance model 120 and an explanation model 124 (FIG. 1). In another aspect, system 500 performs the processes described in the flow of FIG. 2 and generates implementation data 216.

EDA application 550, circuit designs 555, implementation data 216, and any data items used, generated, and/or operated upon by EDA application 550 are functional data structures that impart functionality when employed as part of system 500 or when such elements, including derivations and/or modifications thereof, are loaded into an IC such as a programmable IC causing implementation and/or configuration of a circuit design within the programmable IC.

Figure 9:
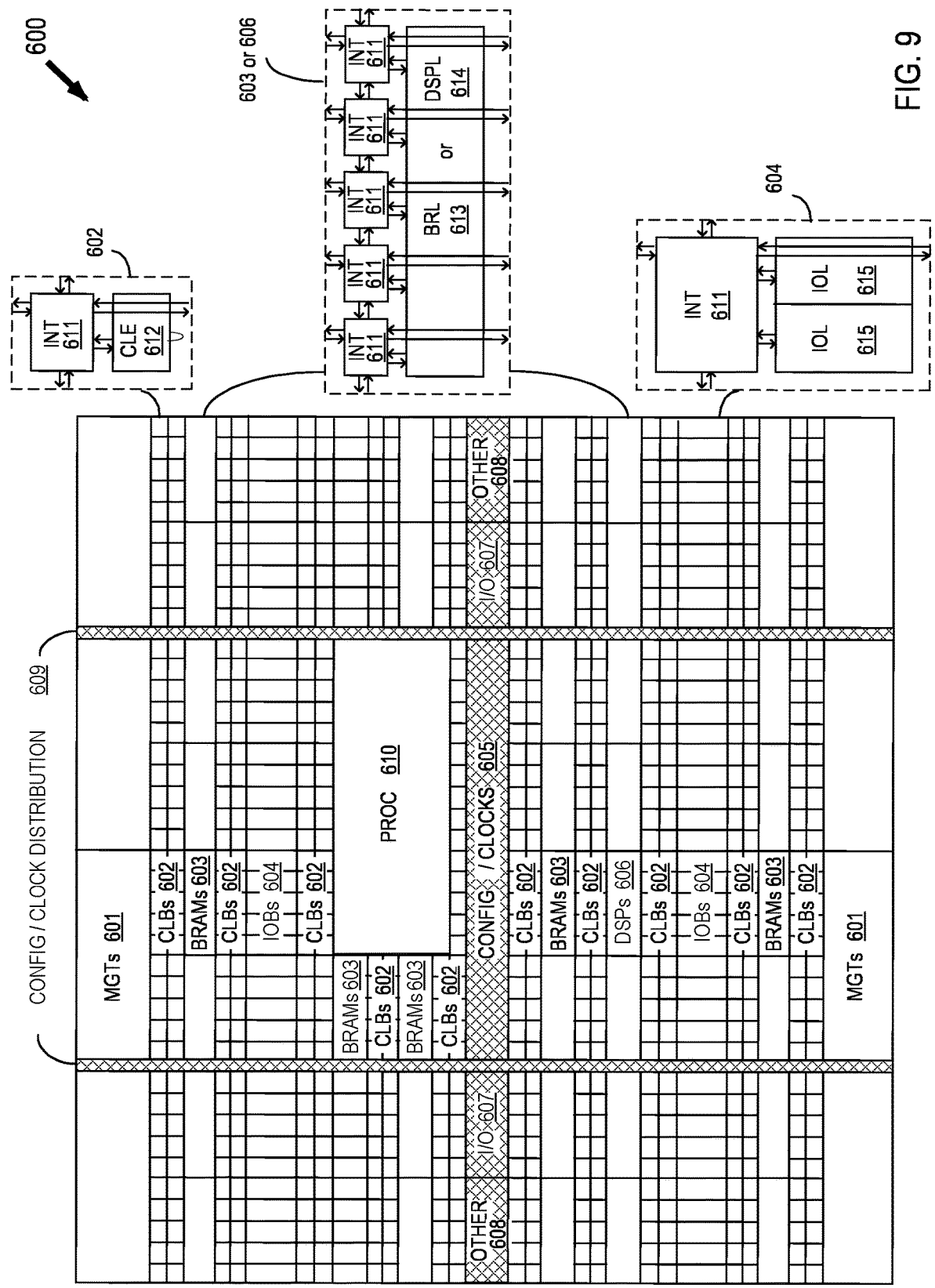
FIG. 9 shows an exemplary programmable integrated circuit (IC).

Some implementations are directed to a computer program product (e.g., nonvolatile memory device), which includes a machine or computer-readable medium having stored thereon instructions which may be executed by a computer (or other electronic device) to perform these operations/activities FIG. 9 shows an exemplary programmable integrated circuit (IC) 600. The programmable IC may also be referred to as a System On Chip (SOC) that includes field programmable gate array logic (FPGA) along with other programmable resources. FPGA logic may include several different types of programmable logic blocks in the array. For example, FIG. 9 illustrates programmable IC 600 that includes a large number of different programmable tiles including multi-gigabit transceivers (MGTs) 601, configurable logic blocks (CLBs) 602, random access memory blocks (BRAMs) 603, input/output blocks (IOBs) 604, configuration and clocking logic (CONFIG/CLOCKS) 605, digital signal processing blocks (DSPs) 606, specialized input/output blocks (I/O) 607, for example, clock ports, and other programmable logic 608 such as digital clock managers, analog-to-digital converters, system monitoring logic, and so forth. Some programmable IC having FPGA logic also include dedicated processor blocks (PROC) 610 and internal and external reconfiguration ports (not shown). Circuit designs processed according to the disclosed methods and systems can also be implemented as ASICs or on an adaptive compute acceleration platform (ACAP). An ACAP has FPGA fabric with distributed memory and hardware-programmable DSP blocks, a multicore SoC, and one or more software programmable, yet hardware adaptable, compute engines, all connected through a network on chip (NoC).

In some FPGA logic, each programmable tile includes a programmable interconnect element (INT) 611 having standardized connections to and from a corresponding interconnect element in each adjacent tile. Therefore, the programmable interconnect elements taken together implement the programmable interconnect structure for the illustrated FPGA logic. The programmable interconnect element INT 611 also includes the connections to and from the programmable logic element within the same tile, as shown by the examples included at the top of FIG. 9.

For example, a CLB 602 can include a configurable logic element CLE 612 that can be programmed to implement user logic, plus a single programmable interconnect element INT 611. A BRAM 603 can include a BRAM logic element (BRL) 613 in addition to one or more programmable interconnect elements. Typically, the number of interconnect elements included in a tile depends on the height of the tile. The illustrated BRAM tile has the same height as five CLBs, but other numbers (e.g., four) can also be used. A DSP tile 606 can include a DSP logic element (DSPL) 614 in addition to an appropriate number of programmable interconnect elements. An 10B 604 can include, for example, two instances of an input/output logic element (IOL) 615 in addition to one instance of the programmable interconnect element INT 611. As will be clear to those of skill in the art, the actual I/O bond pads connected, for example, to the I/O logic element 615, are manufactured using metal layered above the various illustrated logic blocks, and typically are not confined to the area of the input/output logic element 615.

A columnar area near the center of the die (shown shaded in FIG. 9) is used for configuration, clock, and other control logic. Horizontal areas 609 extending from this column are used to distribute the clocks and configuration signals across the breadth of the programmable IC. Note that the references to "columnar" and "horizontal" areas are relative to viewing the drawing in a portrait orientation.

Some programmable ICs utilizing the architecture illustrated in FIG. 9 include additional logic blocks that disrupt the regular columnar structure making up a large part of the programmable IC. The additional logic blocks can be programmable blocks and/or dedicated logic. For example, the processor block PROC 610 shown in FIG. 9 spans several columns of CLBs and BRAMs.

Note that FIG. 9 is intended to illustrate only an exemplary programmable IC architecture. The numbers of logic blocks in a column, the relative widths of the columns, the number and order of columns, the types of logic blocks included in the columns, the relative sizes of the logic blocks, and the interconnect/logic implementations included at the top of FIG. 9 are purely exemplary. For example, in an actual programmable IC, more than one adjacent column of CLBs is typically included wherever the CLBs appear, to facilitate the efficient implementation of user logic.

Though aspects and features may in some cases be described in individual figures, it will be appreciated that features from one figure can be combined with features of another figure even though the combination is not explicitly shown or explicitly described as a combination.

The methods and systems are thought to be applicable to a variety of systems for predicting a performance metric associated with processing a circuit design and providing an explanation that indicates marginal contributions of features of the circuit design to the predicted value of the performance metric. Other aspects and features will be apparent to those skilled in the art from consideration of the specification. The methods and systems can process circuit designs targeted to an application specific integrated circuit (ASIC) or to a programmable logic device. It is intended that the specification and drawings be considered as examples only, with a true scope of the invention being indicated by the following claims.

What is claimed is:

1. A method comprising:
   determining a plurality of features of a circuit design by a design tool executing on a computer;
   applying a first model to the features by the design tool, wherein the first model indicates a predicted value of a performance metric based on the plurality of features;
   applying an explanation model to the features by the design tool, wherein the explanation model indicates levels of contributions by the features to the predicted value of the performance metric, respectively;
   selecting a feature of the plurality of features by the design tool based on the respective levels of contributions;
   looking up by the design tool, a recipe associated with the feature in a database having possible features associated with recipes; and
   processing the circuit design by the design tool according to the recipe into implementation data that is suitable for making an integrated circuit (IC).

2. The method of claim 1, wherein the performance metric indicates an attribute of a circuit implemented from the circuit design.

3. The method of claim 2, wherein the performance metric quantifies one or more of a clock frequency, a power level, or an area.

4. The method of claim 1, wherein the performance metric indicates a performance attribute of the design tool in performing an implementation flow on the circuit design.

5. The method of claim 4, wherein the performance attribute of the design tool is routing runtime.

6. The method of claim 4, wherein the performance attribute of the design tool is a number of expansions performed in routing the circuit design.

7. The method of claim 1, wherein:
   the selecting the feature includes selecting one or more features having respective levels of contributions greater than a general threshold;
   the looking up the recipe includes looking up one or more recipes associated with the one or more features; and
   the processing the circuit design includes processing the circuit design by the design tool according to the one or more recipes.

8. The method of claim 7, wherein:
   a particular feature of the one or more features has a plurality of associated recipes and each recipe of the plurality of associated recipes has an associated secondary threshold value; and
   the looking up one or more recipes associated with the one or more features includes selecting a particular recipe in response to satisfaction of the associated secondary threshold value of the particular recipe by the respective level of contribution of the particular feature.

9. The method of claim 1 wherein the recipe specifies actions that change the circuit design.

10. The method of claim 1 wherein the recipe specifies parameter settings of the design tool for processing the circuit design into the implementation data.

11. The method of claim 1, further comprising configuring a programmable IC with the implementation data to implement the circuit design on the programmable IC.

12. The method of claim 1, further comprising:
    performing implementation flows including synthesis, netlist optimization, placement, physical synthesis, and routing by the design tool on circuit designs of a training set;
    determining actual values of the performance metric from the implementation flows on the circuit designs, respectively;
    determining respective feature sets of the circuit designs;
    training the first model using the actual values of the performance metric and feature sets; and
    training the explanation model using the actual values of the performance metric, feature sets, and trained first model.

13. The method of claim 12, wherein the training the explanation model includes determining Shapley values of the features.

14. The method of claim 12, wherein:
    the actual values of the performance metric indicate routing runtimes; and
    the training the first model includes weighting the training using the actual values of the performance metric and feature sets, in proportion to the actual values of the performance metric.

15. The method of claim 14, wherein the actual values of the performance metric are numbers of expansions during the routing.

16. The method of claim 12, wherein:
    performing implementation flows includes performing an initial routing and a final routing; and
    determining the respective feature set of a circuit design of the training set includes:
      determining for each routing area of a plurality of routing areas of a programmable IC, a level of utilization of routing resources within the routing area after the initial routing and before the final routing,
      determining for each region of a plurality of regions of the programmable IC, an average of the levels of utilization of routing resources within routing areas of the region, and
      specifying in the respective feature set, a count of the regions having average levels of utilization greater than a threshold.

17. The method of claim 16, wherein:
    determining for each region of the plurality of regions of the programmable IC, the average of the levels of utilization of routing resources within routing areas of the region includes, determining averages for regions of different sizes; and
    specifying in the respective feature set the count of the regions having average levels of utilization greater than the threshold includes, specifying in the respective feature set for each size of the different sizes of regions, a count of the regions of that size having average levels of utilization greater than the threshold.

18. The method of claim 16, wherein:
    determining for each routing area of the plurality of routing areas of the programmable IC, a level of utilization of routing resources within the routing area includes, determining levels of utilization of different types of routing resources within the routing area, respectively;

determining for each region of the plurality of regions of the programmable IC, the average of the levels of utilization of routing resources within routing areas of the region includes, determining an average level of utilization for each different type of routing resource; and specifying in the respective feature set the count of the regions having average levels of utilization greater than the threshold includes, specifying in the respective feature set for each of the different types of routing resources, a count of the regions having average levels of utilization of that type of routing resource greater than the threshold.

19. A system comprising:

one or more computer processors configured to execute program code; and a memory arrangement coupled to the one or more computer processors, wherein the memory arrangement is configured with instructions of a design tool that when executed by the one or more computer processors cause the one or more computer processors to perform operations including:

determining a plurality of features of a circuit design;

applying a first model to the features, wherein the first model indicates a predicted value of a performance metric in response to the plurality of features;

applying an explanation model to the features, wherein the explanation model indicates levels of contributions by the features to the predicted value of the performance metric, respectively;

selecting a feature of the plurality of features based on the respective levels of contributions;

looking up a recipe associated with the feature in a database having possible features associated with recipes; and processing the circuit design according to the recipe into implementation data that is suitable for making an integrated circuit (IC).

20. The system of claim 19, wherein the performance metric indicates an attribute of a circuit implemented from the circuit design or a performance attribute quantifying performing an implementation flow on the circuit design.

* * * * *